United States Patent
Zhu et al.

(10) Patent No.: US 11,887,912 B2
(45) Date of Patent: Jan. 30, 2024

(54) THROUGH SILICON VIA STRUCTURE FOR THREE-DIMENSIONAL INTEGRATED CIRCUIT PACKAGING AND MANUFACTURING METHOD THEREOF

(71) Applicants: FUDAN UNIVERSITY, Shanghai (CN); SHANGHAI INTEGRATED CIRCUIT MANUFACTURING INNOVATION CENTER CO., LTD, Shanghai (CN)

(72) Inventors: Bao Zhu, Shanghai (CN); Lin Chen, Shanghai (CN); Qingqing Sun, Shanghai (CN); Wei Zhang, Shanghai (CN)

(73) Assignees: Fudan University, Shanghai (CN); Shanghai Integrated Circuit Manufacturing Innovation Center Co., Ltd., Shanghai (CN)

(*) Notice: Subject to any disclaimer, the term of this patent is extended or adjusted under 35 U.S.C. 154(b) by 353 days.

(21) Appl. No.: 17/052,853

(22) PCT Filed: Jul. 2, 2020

(86) PCT No.: PCT/CN2020/099977
§ 371 (c)(1),
(2) Date: Mar. 23, 2021

(87) PCT Pub. No.: WO2021/253513
PCT Pub. Date: Dec. 23, 2021

(65) Prior Publication Data
US 2023/0099959 A1    Mar. 30, 2023

(30) Foreign Application Priority Data
Jun. 18, 2020  (CN) .......................... 202010562310.8

(51) Int. Cl.
*H01L 23/48*  (2006.01)
*H01L 21/768*  (2006.01)
(Continued)

(52) U.S. Cl.
CPC ...... *H01L 23/481* (2013.01); *H01L 21/76841* (2013.01); *H01L 21/76898* (2013.01)

(58) Field of Classification Search
CPC ............. H01L 23/481; H01L 21/76841; H01L 21/76898; H01L 2224/14181; H01L 21/26506; H01L 21/3065
See application file for complete search history.

(56) References Cited

U.S. PATENT DOCUMENTS

| 5,877,070 A * | 3/1999 | Goesele ............ H01L 21/76251 |
| | | 117/915 |
| 2003/0038344 A1* | 2/2003 | Palmer .................... H01L 23/15 |
| | | 257/E21.597 |

(Continued)

FOREIGN PATENT DOCUMENTS

| CN | 103426847 A | 12/2013 |
| CN | 104347492 A | 2/2015 |

(Continued)

OTHER PUBLICATIONS

International Search Report and Written Opinion for PCT Application No. PCT/CN2020/099977; China National Intellectual Property Administration; Beijing, China; dated Mar. 10, 2021.

(Continued)

*Primary Examiner* — Herve-Louis Y Assouman
(74) *Attorney, Agent, or Firm* — Thomas E. Lees, LLC

(57) ABSTRACT

The present disclosure belongs to the technical field of integrated circuit packaging, and specifically relates to a through silicon via structure for three-dimensional integrated circuit packaging and a manufacturing method (Continued)

thereof. The method of the present disclosure includes the following steps: lifting off a silicon wafer by implanting hydrogen ions into the silicon wafer to obtain a substrate for making a through silicon via; performing double-sided plasma etching on the substrate to form a through silicon via penetrating the substrate; depositing an insulating medium, a copper diffusion barrier layer, and a seed layer; and removing parts of the copper diffusion barrier layer and the seed layer by photolithography and etching processes, leaving only parts of the copper diffusion barrier layer and the seed layer on a sidewall of the through silicon via; forming a sacrificial layer on the upper and lower surfaces of the resulting structure, completely filling in the through silicon via with conductive metal material, and then removing the sacrificial layer, upper and lower surfaces of the conductive metal material respectively protruding from upper and lower surfaces of the insulating medium; and forming a contact pad on a surface of the conductive metal material. The present disclosure can effectively improve production efficiency and lower the cost.

10 Claims, 7 Drawing Sheets

(51) Int. Cl.
*H01L 21/265* (2006.01)
*H01L 21/3065* (2006.01)

(56) References Cited

U.S. PATENT DOCUMENTS

| | | | |
|---|---|---|---|
| 2008/0083558 A1* | 4/2008 | Chujo | H05K 3/4644 174/250 |
| 2017/0207169 A1* | 7/2017 | Lee | H01L 29/45 |
| 2020/0066617 A1 | 2/2020 | Pandey et al. | |

FOREIGN PATENT DOCUMENTS

| | | |
|---|---|---|
| CN | 105405838 A | 3/2016 |
| CN | 110010476 A | 7/2019 |

OTHER PUBLICATIONS

English Translation of Written Opinion for PCT Application No. PCT/CN2020/099977; China National Intellectual Property Administration; Beijing, China; dated Mar. 10, 2021.

First Office Action for Chinese Patent Application No. 202010562310.8; The State Intellectual Property Office of People's Republic of China; Beijing, China.

First Search Report for Chinese Patent Application No. 202010562310.8; The State Intellectual Property Office of People's Republic of China; Beijing, China.

Supplementary Search Report for Chinese Patent Application No. 202010562310.8; The State Intellectual Property Office of People's Republic of China; Beijing, China.

* cited by examiner

THROUGH SILICON VIA STRUCTURE FOR THREE-DIMENSIONAL INTEGRATED CIRCUIT PACKAGING AND MANUFACTURING METHOD THEREOF

TECHNICAL FIELD

The present disclosure belongs to the technical field of integrated circuit packaging, and more particularly, relates to a through silicon via structure for three-dimensional integrated circuit packaging and a manufacturing method thereof.

BACKGROUND

With rapid development of integrated circuit technology, microelectronic packaging technology has gradually become a main factor restricting the development of semiconductor technology. In order to achieve high-density electronic packaging, better performance and lower overall cost, technicians have developed a series of advanced packaging technologies, as one of which, the three-dimensional packaging technology has good electrical performance and high reliability, and meanwhile, the three-dimensional packaging technology can achieve high packaging density, so that it is widely used in various high-speed circuits and miniaturized systems. Through silicon via technology is a new technology for stacking chips in a three-dimensional integrated circuit to achieve interconnection. A plurality of vertical interconnection vias are made on silicon wafers to achieve electrical interconnection between different chips. Through silicon via technology can achieve maximum stacking density of the chips in the three-dimensional direction, the shortest interconnection lines between chips, and the smallest overall size, greatly improve the performance of chip speed and low power consumption, and has currently become the most attracting electronic packaging technology.

In order to meet the requirements of the overall thickness of the package, for a conventional manufacturing process of a through silicon via, one of the most important steps is thinning the silicon wafer. However, for thinning silicon wafers, mechanical grinding is usually used, during which silicon material of a considerable thickness will be removed without being recycled, resulting in a lot of waste of silicon material. In addition, for the through silicon via structure, since the through via penetrates the entire silicon wafer, the through via is generally very deep. In the conventional formation process of the through silicon via, for the silicon water that has been thinned, the silicon water is usually etched on one side with a dry or wet etching process until the bottom of the silicon water is penetrated. Since the silicon wafer is only etched on one side, the etching rate of this process is rather low, which may affect production efficiency.

SUMMARY

The objective of the present disclosure is to provide a through silicon via structure for three-dimensional integrated circuit packaging and a manufacturing method thereof, which has a high etching rate, high production efficiency and low process complexity.

The method for manufacturing a through silicon via structure for three-dimensional integrated circuit packaging provided by the present disclosure includes the following specific steps:

lifting off a silicon wafer by implanting hydrogen ions into the silicon wafer to obtain a substrate for making a through silicon via;

performing double-sided plasma etching on the substrate to form a through silicon via penetrating the substrate;

depositing sequentially an insulating medium, a copper diffusion barrier layer and a seed layer on a sidewall of the through silicon via and upper and lower surfaces of the substrate, and removing parts of the copper diffusion barrier layer and the seed layer by photolithography and etching processes, leaving only parts of the copper diffusion harder layer and the seed layer on the sidewall of the through silicon via;

forming a sacrificial layer on upper and lower surfaces of the resulting structure, completely filling in the through silicon via with conductive metal material, and then removing the sacrificial layer, upper and lower surfaces of the conductive metal material respectively protruding from upper and lower surfaces of the insulating medium; and forming contact pads on surfaces of the conductive metal material.

In the manufacturing method of the present disclosure, preferably, the step of obtaining a substrate for making a through silicon via specifically includes:

first, growing a layer of silicon dioxide film on a surface of the silicon wafer by thermal oxidation;

then, implanting hydrogen ions into the silicon wafer by ion implantation, the hydrogen ions diffusing into the silicon wafer through the silicon dioxide;

afterwards, annealing the silicon wafer to foam a hydrogen in a micro cavity where the hydrogen is implanted, such that the silicon wafer is lifted off; and finally, removing, by a wet etching process, the silicon dioxide on a surface of the silicon wafer resulting from the lifting off, and planarizing the bottom of the silicon wafer by a chemical-mechanical polishing method, thereby obtaining a substrate for making a through silicon via.

In the manufacturing method of the present disclosure, preferably, the hydrogen ion implantation depth range is changed by changing the hydrogen ion implantation energy, and the hydrogen ion implantation energy is selected to be greater than 5000 KeV to obtain a through silicon via with a depth greater than 50 microns.

In the manufacturing method of the present disclosure, preferably, a temperature range for annealing the silicon wafer is 300-400° C.

In the manufacturing method of the present disclosure, preferably, the conductive metal material is copper.

The present disclosure also discloses a through silicon via structure for three-dimensional integrated circuit packaging, including:

a through silicon via penetrating a substrate;

an insulating medium covering a sidewall of the through silicon via and upper d lower surfaces of the substrate;

a copper diffusion barrier layer and a seed layer, wherein the copper diffusion barrier layer covers the insulating medium on the sidewall of the through silicon via, and the seed layer covers a surface of the copper diffusion barrier layer;

conductive metal material and contact pads, wherein the conductive metal material completely tills the through silicon via, extends upward and downward, and protrudes from upper and lower surfaces of the insulating medium; and the contact pads are disposed on the top and bottom of the conductive metal material.

In the through silicon via structure of the present disclosure, preferably, the conductive metal material is copper.

In the through silicon via structure of the present disclosure, preferably, the insulating medium is at least one of $SiO_2$, $Si_3N_4$, SiON, SiCOH, and SiCOFH.

In the through silicon via structure of the present disclosure, preferably, the copper diffusion barrier layer is at least one of TaN, TiN, ZrN, and $MnSiO_3$.

In the through silicon via structure of the present disclosure, preferably, the seed layer is at least one of Cu, Ru, Co, RuCo, CuRu, and CuCo.

In the present disclosure, by implanting hydrogen ions into a silicon wafer to lift off the silicon wafer to obtain a substrate for making a through silicon via, the silicon material can be fully utilized and the cost can be lowered. By performing double-sided plasma etching on the silicon substrate to obtain a through silicon via, the etching rate can be increased and production efficiency can be improved. There is no need to chemically-mechanically polish the copper material after copper electroplating, which can greatly reduce the process complexity.

DETAILED DESCRIPTION OF THE EMBODIMENTS

Figure 1:
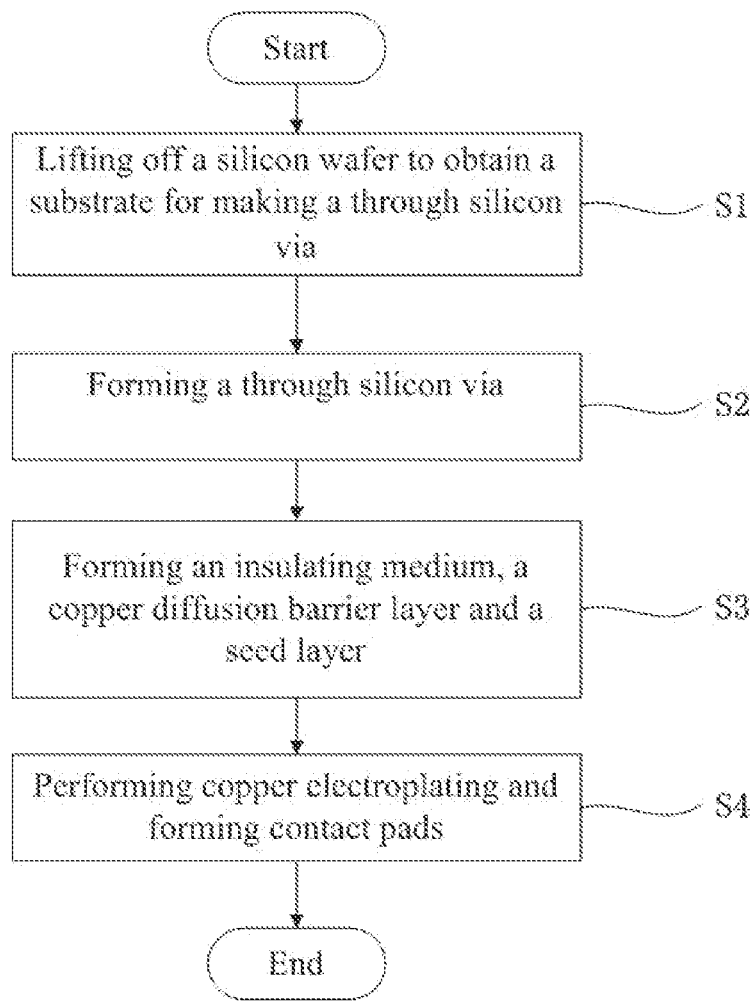
FIG. 1 is a flow chart illustrating a manufacturing process of a through silicon via structure for three-dimensional integrated circuit packaging.

In order to make the objectives, technical solutions and advantages of the present invention clearer, the following will clearly and completely describe the technical solutions in the embodiments of the present invention with reference to the accompanying drawings in the embodiments of the present invention. It should be understood that the specific embodiments described here are only used to explain the present invention, not to limit the present invention. The described embodiments are only a part of the embodiments of the present invention, rather than all the embodiments. Based on the embodiments of the present invention, all other embodiments obtained by those of ordinary skill in the art without creative work shall fall within the protection scope of the present invention.

In the description of the present invention, it should be noted that the orientation or positional relationship indicated by the terms "upper", "lower", "vertical", "horizontal", and the like is based on the orientation or positional relationship shown in the drawings, and is only for convenient description of the present invention and simplify the description, rather than indicating or implying that the device or element referred to must have a specific orientation, or must be constructed and operated in a specific orientation, and therefore cannot be understood as a limitation of the present invention. In addition, the terms "first" and "second" are only used for descriptive purposes, and cannot be understood as indicating or implying relative importance.

In addition, many specific details of the present invention are described below, such as the structure, materials, dimensions, processing method and technology of the device, in order to understand the present invention more clearly. However, as those skilled in the art can understand, the present invention may not be implemented according to these specific details. Unless specifically indicated in the following, each part of the device may be made of materials known to those skilled in the art, or of materials with similar functions developed in the future may be used.

The technical solution of the present disclosure will be further described below in conjunction with accompanying drawings FIGS. 1-13 and embodiments. FIG. 1 is a flow chart illustrating a manufacturing process of a through silicon via structure for three-dimensional integrated circuit packaging, and FIGS. 2-13 show schematic structural diagrams of steps of the manufacturing process of a through silicon via structure fix three-dimensional integrated circuit packaging. As shown in FIG. 1, the specific preparation steps are as follows.

Figure 2:
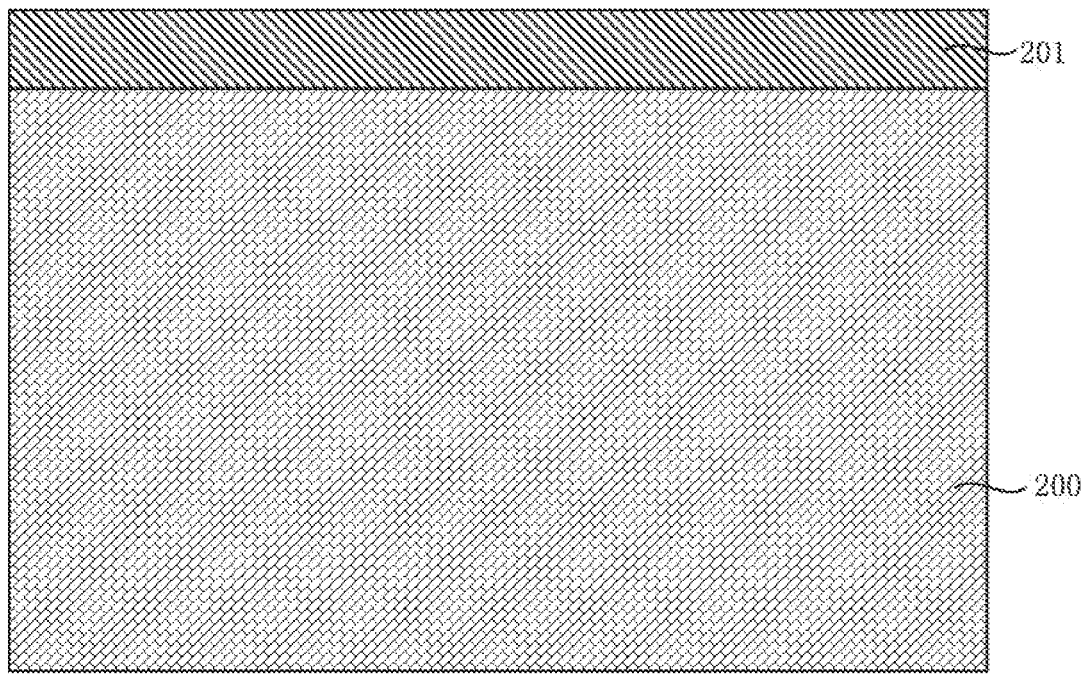
FIGS. 2 to 5 are schematic structural diagrams illustrating steps of lifting off a silicon wafer to obtain a substrate.
Figure 3:
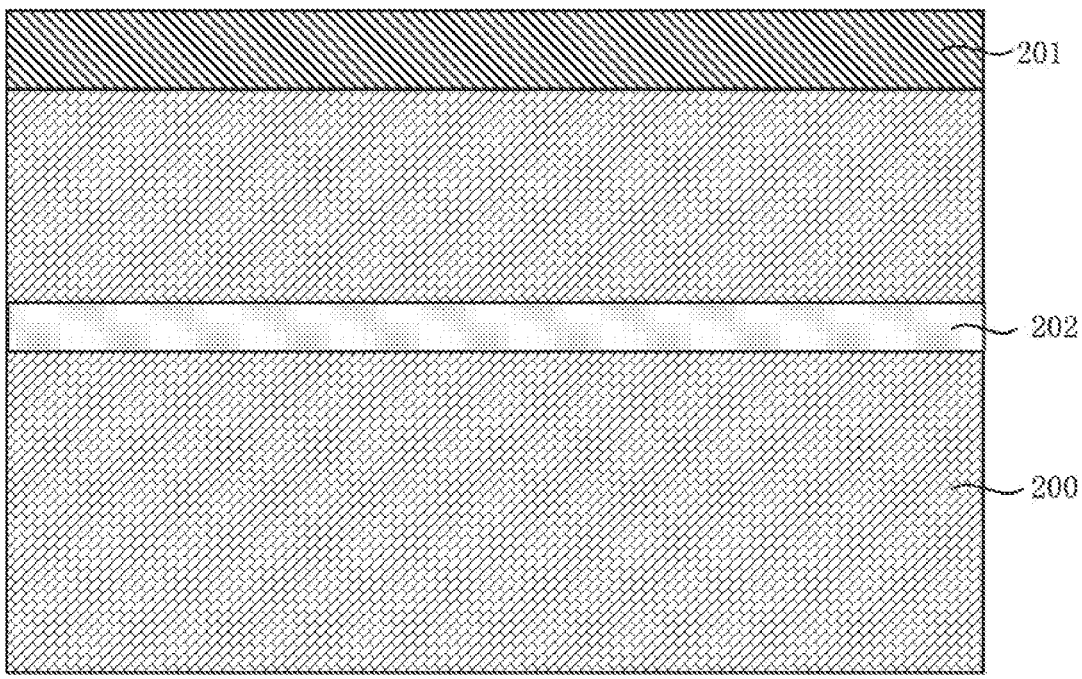

At step S1, a silicon wafer is lifted off to obtain a substrate for making a through silicon via. First, a layer of $SiO_2$ film 201 of a thickness in a range of 200 to 500 nm is grown on a surface of the silicon wafer 200 by a thermal oxidation method. The resulting structure is shown in FIG. 2. Then, hydrogen ions 202 are implanted into the silicon wafer 200 by ion implantation, and the hydrogen ions 202 diffuse into the silicon wafer 200 through the silicon dioxide 201. The resulting structure is shown in FIG. 3. By changing the hydrogen ion implantation energy, a depth range of the hydrogen ion implantation can be changed. In order to obtain a through silicon via of a thickness greater than 50 microns, the hydrogen ion implantation energy is selected to be greater than 5000 KeV.

Figure 4:
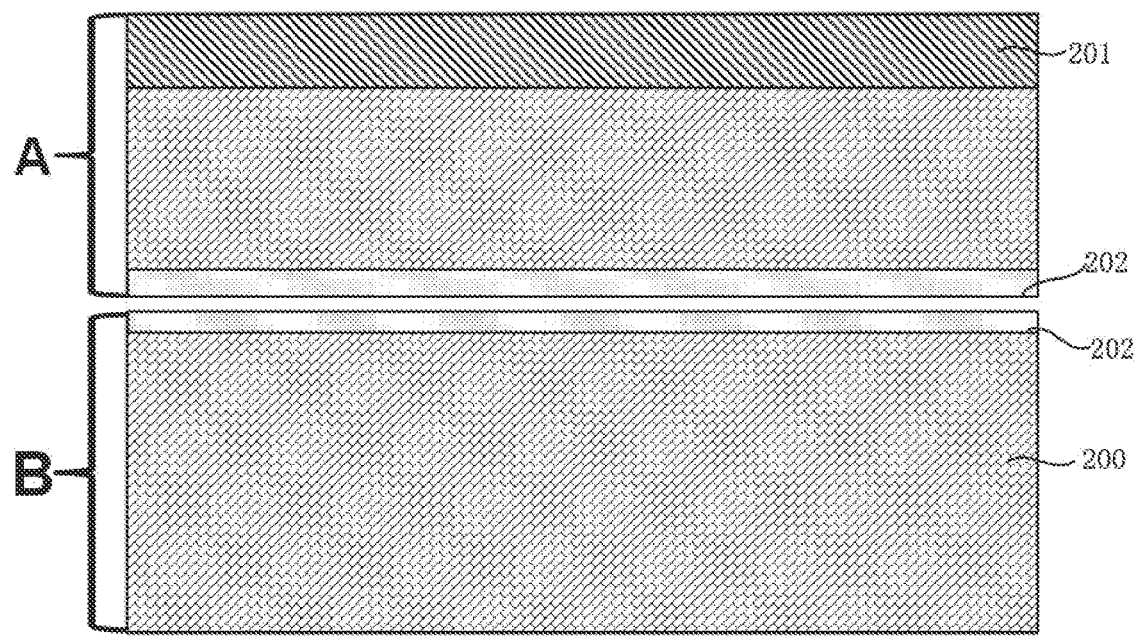

Then, the silicon wafer is put into a tube furnace to be annealed at an annealing temperature in a range of 300~400° C. The hydrogen foams in a micro cavity at the hydrogen implantation, and the silicon wafer 200 is lifted off and splits into two parts, where the upper part is a silicon wafer A with its surface covered by the silicon dioxide, and the lower part is a silicon wafer B not covered by the silicon dioxide. The resulting structure is shown in FIG. 4.

Figure 5:
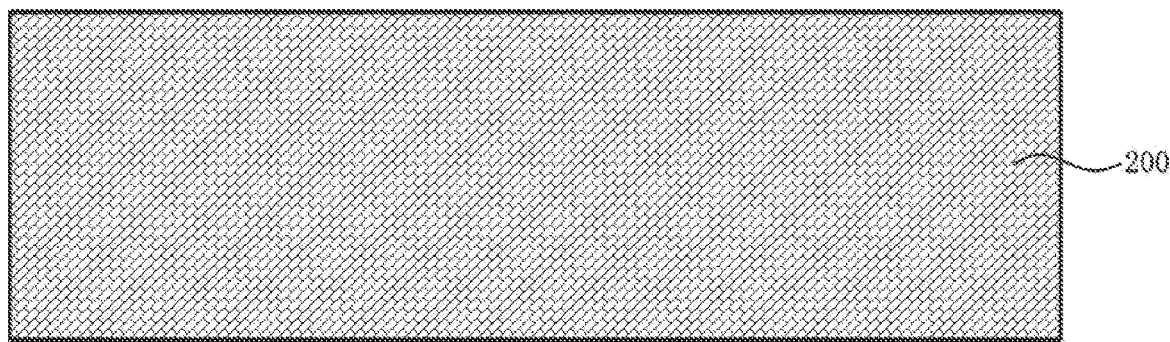

The silicon dioxide 201 on the surface of the silicon wafer A is removed by a wet etching process, and the bottom of the silicon wafer A is planarized by a chemical-mechanical polishing method, thereby obtaining a substrate for making a through silicon via. The resulting structure is shown in FIG. 5. As for the silicon wafer B, the above process can be continued to perform lifting off, so as to obtain more substrates for making through silicon vias. By implanting hydrogen ions into a silicon wafer to lift off the silicon wafer to obtain a substrate for making a through silicon via, the silicon material can be fully utilized and the cost can be lowered.

Figure 6:
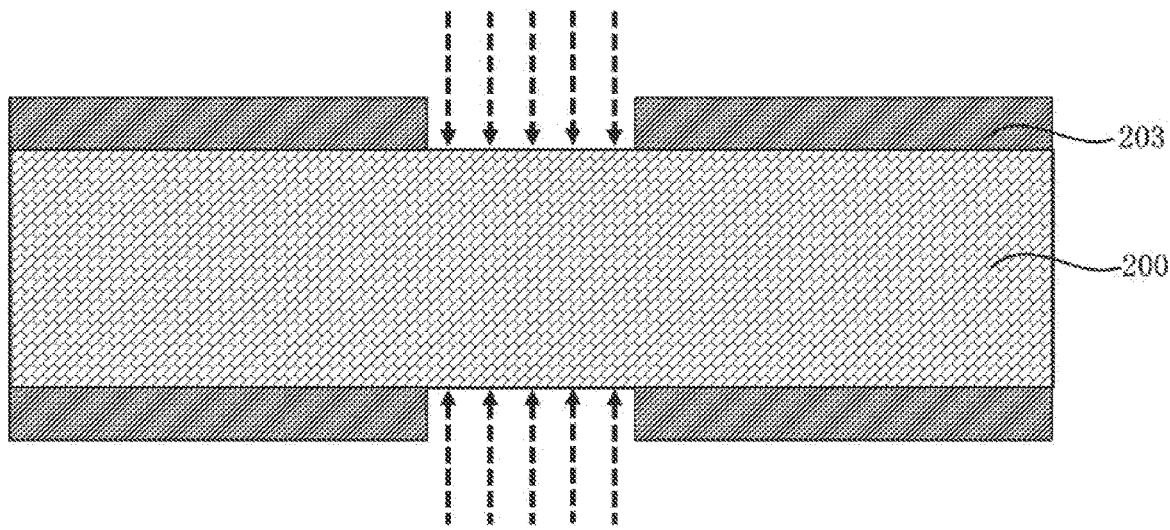
FIGS. 6 to 7 are schematic structural diagrams illustrating steps of forming a through silicon via.
Figure 7:
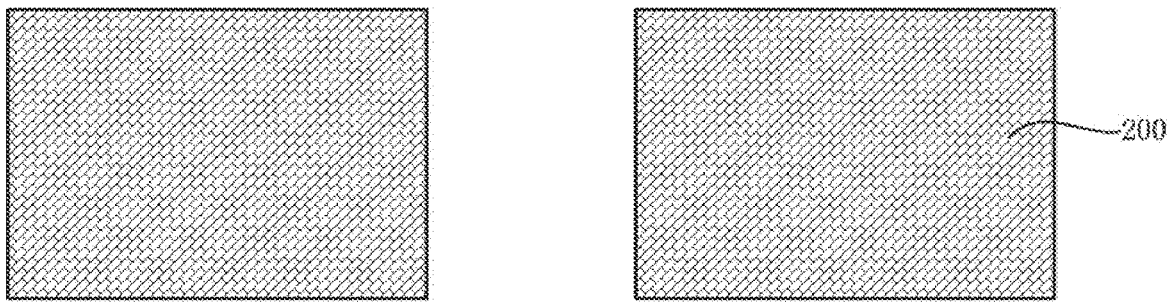

At step S2, a through silicon via is formed. Photoresist 203 is spin-coated on the upper and lower surfaces of the obtained silicon substrate 200, and a pattern of a through silicon via is defined through exposure and development processes. The resulting structure is shown in FIG. 6. Referring to FIG. 6, plasma etching is performed on the patterns of the upper and lower surfaces of the silicon substrate 200 at the same time until the silicon substrate 200 is penetrated. The photoresist 203 is then dissolved or ached in a solvent, and the resulting structure is shown in FIG. 7. The employed plasma can be at least one of $CF_4$ and $SF_6$. By performing double-sided plasma etching on the silicon substrate to obtain a through silicon via, the etching rate can be increased and production efficiency can be improved.

Figure 8:
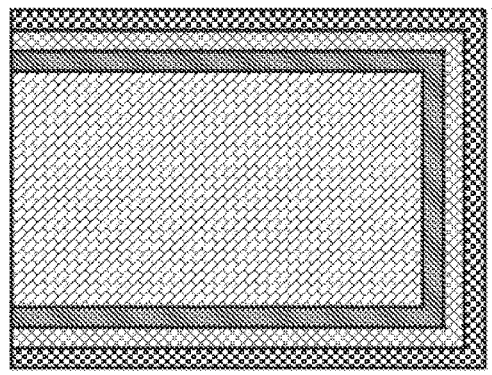
FIGS. 8 to 9 are schematic structural diagrams illustrating steps of forming an insulating medium, a copper diffusion barrier layer and a seed layer.
Figure 8:
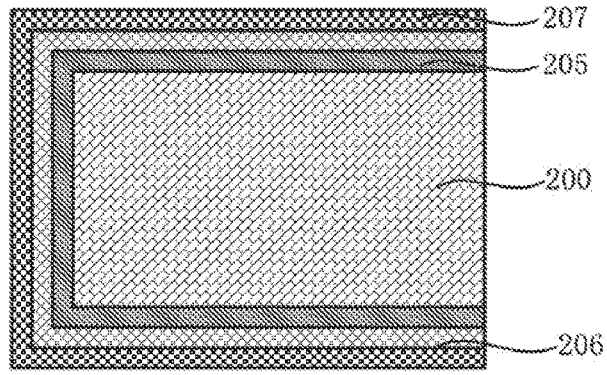

At step S3, an insulating medium, a copper diffusion barrier layer and a seed layer are formed. A layer of $SiO_2$ film is deposited on a sidewall of the through silicon via and the upper and lower surfaces of the substrate as an insulating medium 205 by a chemical vapor deposition method. Then, a layer of TaN film is grown on the surface of the $SiO_2$ film 205 as a copper diffusion barrier layer 206 by a physical vapor deposition method. Next, a layer of Cu film is grown on the surface of the TaN film 206 as a seed layer 207 by a physical vapor deposition method. The resulting structure is shown in FIG. 8. In the present disclosure, $SiO_2$ is used as the insulating medium, TaN is used as the copper diffusion barrier layer, and the Cu film is used as the seed layer. However, the present disclosure is not limited to this, and at least one of $SiO_2$, $Si_3N_4$, SiON, SiCOH, and SiCOFH can be selected as an insulating medium; at least one of TaN, TiN, ZrN, and $MnSiO_3$ can be selected as the copper diffusion barrier layer; at least one of Cu, Ru, Co, RuCo, CuRu, and CuCo can be selected as the seed layer. The growth mode of the copper diffusion barrier layer and the seed layer can also be chemical vapor deposition or atomic layer deposition.

Figure 9:
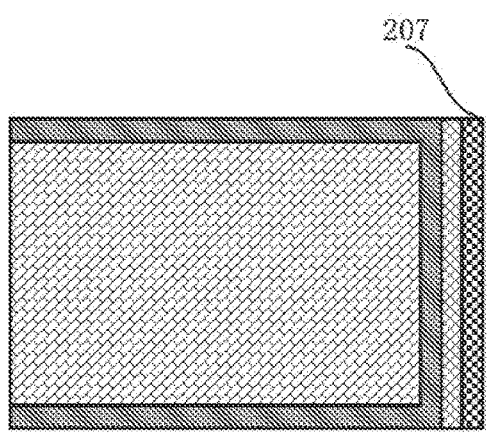
Figure 9:
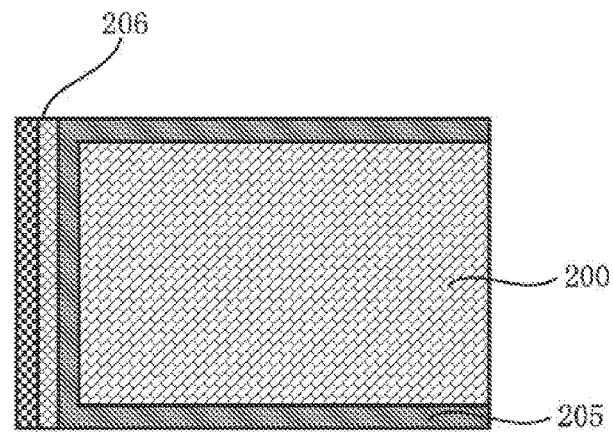

Finally, part of the TaN barrier layer 206 and part of the Cu seed layer 207 are removed by photolithography and etching processes, and the resulting structure is shown in FIG. 9. The remaining TaN barrier layer 206 only covers the surface of the $SiO_2$ film 205 on the sidewall of the through silicon via. Correspondingly, the remaining Cu seed layer 207 only covers the surface of the TaN barrier layer 206 on the sidewall of the through silicon via.

Figure 10:
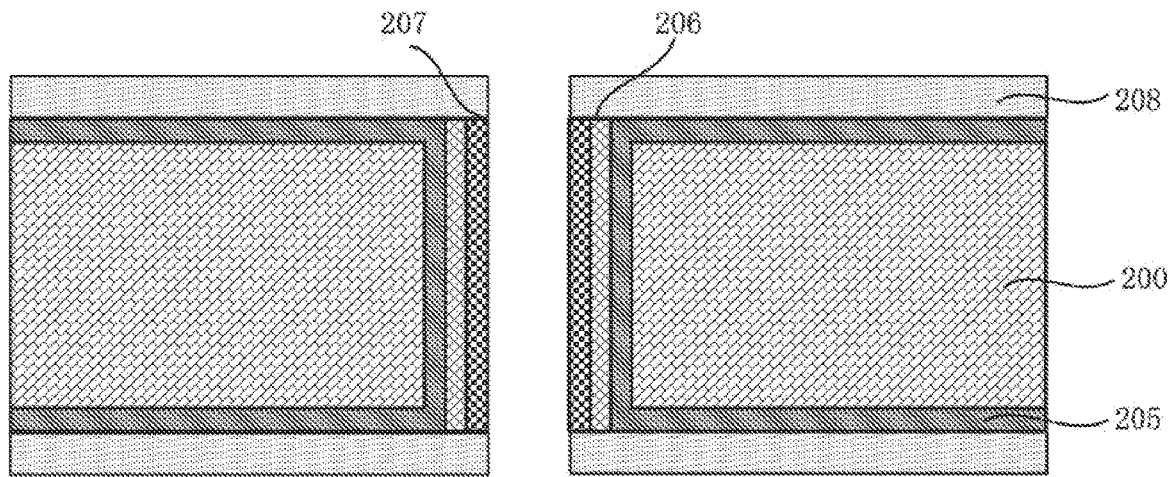
FIGS. 10 to 13 are schematic structural diagrams illustrating steps of copper electroplating and forming contact pads.
Figure 11:
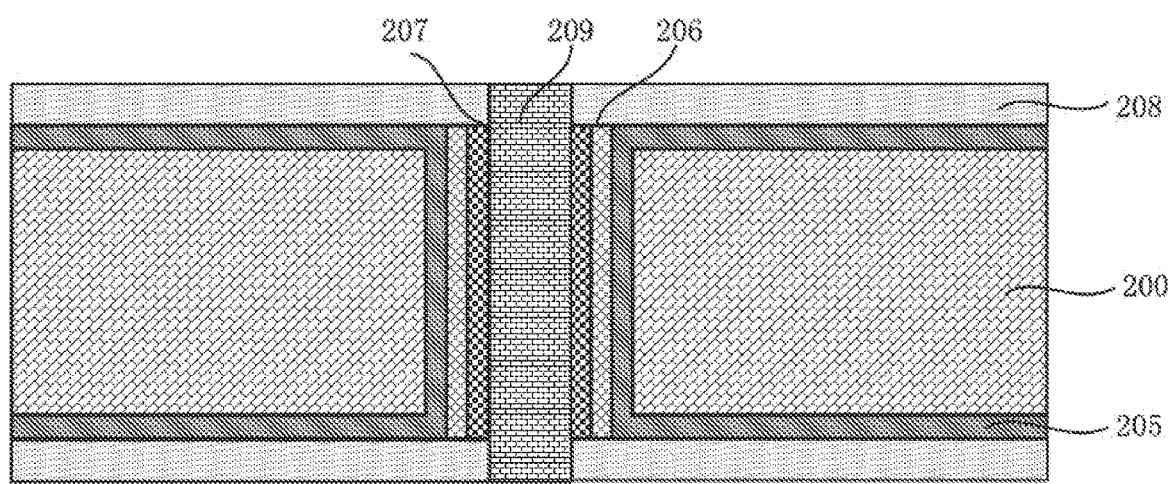
Figure 12:
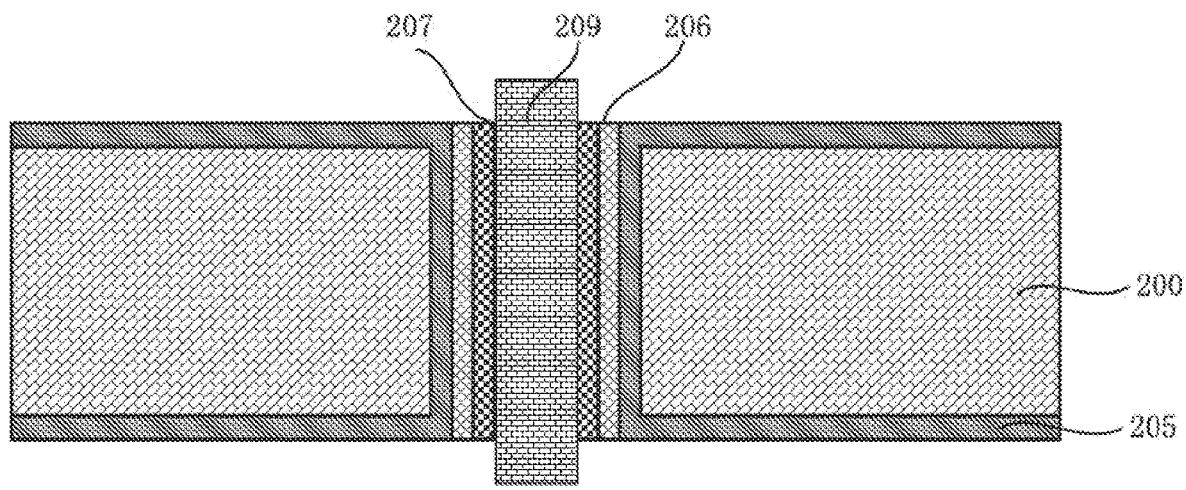

At step S4, copper electroplating is performed and contact pads are formed. First, photoresist is spin-coated on the surfaces of the obtained structure, and the pattern is defined by exposure and development. Then a layer of metal Ni film is grown as a sacrificial layer 208 by an electron beam evaporation process. Next, the photoresist and the metal Ni film on the surface of the photoresist are removed in a solvent by a lift-off process. The resulting structure is shown in FIG. 10. Subsequently, copper material 209 is electroplated in the through silicon via and completely fills in the through silicon via by an electroplating process. The resulting structure is shown in FIG. 11. Further, the metal Ni film 208 is removed by photolithography and etching processes, and the resulting structure is shown in FIG. 12. As shown in FIG. 12, the conductive metal material 209 respectively extends up and down out of the through silicon via, the upper surface of the conductive metal material 209 is higher than the upper surface of the insulating medium 205, and the lower surface of the conductive metal material 209 is lower than the lower surface of the insulating medium 205.

Figure 13:
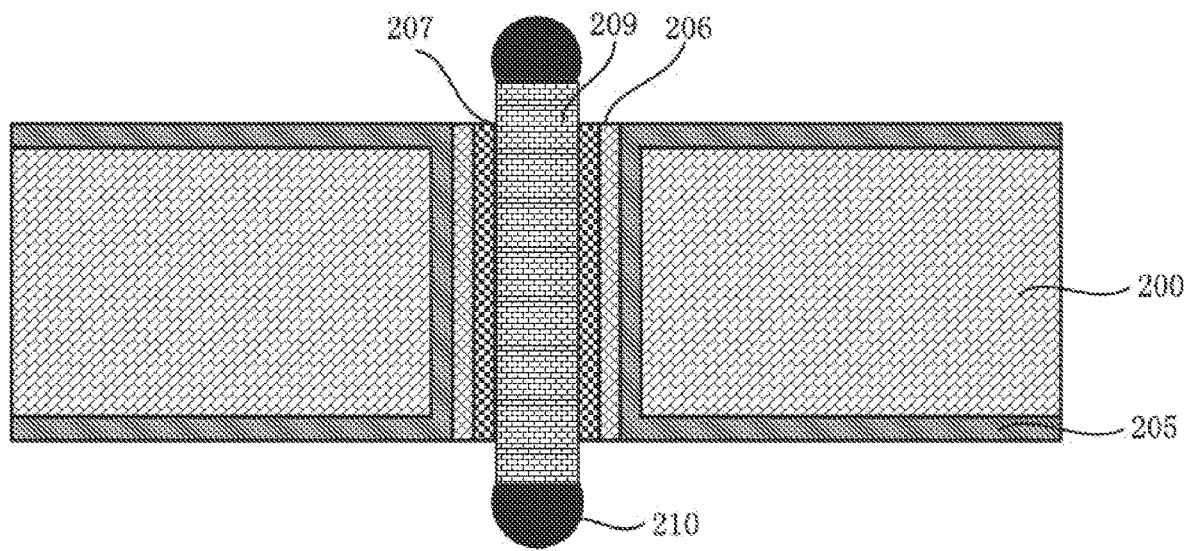

Finally, metal Sn material is welded on the surfaces of the copper material 209 as contact pads 210, and the resulting structure is shown in FIG. 13. In the present disclosure, a metal Ni film is used as the sacrificial layer, but the present disclosure is not limited to this, and any one of Ni, Ti, Ta, and Cr can be selected as the sacrificial layer. There is no need to chemically-mechanically polish the copper material after copper electroplating, which can greatly reduce the process complexity.

The through silicon via structure for three-dimensional integrated circuit packaging of the present disclosure, as shown in FIG. 13, includes: a through silicon via penetrating a substrate; an insulating medium 205 covering a sidewall of the through silicon via and upper and lower surfaces of the substrate; a copper diffusion barrier layer 206 and a seed layer 207, wherein the copper diffusion barrier layer 206 covers the insulating medium 205 on the sidewall of the through silicon via, and the seed layer 207 covers a surface of the copper diffusion barrier layer 206; and conductive metal material 209 and contact pads 210, wherein the conductive metal material 209 completely fills in the through silicon via, extends upward and downward, and protrudes from upper and lower surfaces of the insulating medium 205, and the contact pads 210 are disposed on the top and bottom of the conductive metal material 209.

Preferably, the insulating medium 205 is at least one of $SiO_2$, $Si_3N_4$, SiON, SiCOH, and SiCOFH. The copper diffusion barrier layer 206 is at least one of TaN, TiN, ZrN, and $MnSiO_3$. The seed layer 207 is at least one of Cu, Ru, Co, RuCo, CuRu, and CuCo. The sacrificial layer 208 can be any one of Ni, Ti, Ta, and Cr. The conductive metal material 209 is copper, for example.

The above are only specific embodiments of the present disclosure, but the protection scope of the present disclosure is not limited thereto. All modifications or substitutions readily devised by those skilled in the art within the technical scope disclosed in the present disclosure should be covered within the protection scope of the present disclosure.

The invention claimed is:

1. A manufacturing method of a through silicon via structure for three-dimensional integrated circuit packaging, comprising steps of:
   lifting off a silicon wafer by implanting hydrogen ions into the silicon wafer to obtain a substrate for making a through silicon via;
   performing double-sided plasma etching on the substrate to form a through silicon via penetrating the substrate;
   depositing sequentially an insulating medium, a copper diffusion barrier layer, and a seed layer on a sidewall of the through silicon via and upper and lower surfaces of the substrate, and removing parts of the copper diffusion barrier layer and the seed layer by photolithography and etching processes, leaving only parts of the copper diffusion barrier layer and the seed layer on the sidewall of the through silicon via;
   forming a sacrificial layer on upper and lower surfaces of the resulting structure, completely filling the through silicon via with conductive metal material, and then removing the sacrificial layer, upper and lower surfaces of the conductive metal material respectively protruding from upper and lower surfaces of the insulating medium; and
   forming contact pads on surfaces of the conductive metal material;
   wherein the conductive metal material is in direct contact with the seed layer, and the conductive metal material is not in direct contact with the sacrificial layer;
   wherein the insulating medium disposed on the sidewall of the through silicon via is covered by the copper diffusion barrier layer, the upper and lower surfaces of the insulating medium are not covered by the copper diffusion barrier layer, and the copper diffusion barrier layer disposed on the sidewall of the through silicon via is covered by the seed layer.

2. The manufacturing method of a through silicon via structure for three-dimensional integrated circuit packaging of claim 1, wherein the step of obtaining a substrate for making a through silicon via comprises:
   first, growing a layer of silicon dioxide film on a surface of the silicon wafer by thermal oxidation;

then, implanting hydrogen ions into the silicon wafer by ion implantation, the hydrogen ions diffusing into the silicon wafer through the silicon dioxide;

afterwards, annealing the silicon wafer to foam hydrogen in a micro cavity where the hydrogen is implanted, such that the silicon wafer is lifted off and splits into an upper silicon wafer and a lower silicon wafer; and finally, removing, by a wet etching process, the silicon dioxide on a surface of the upper silicon wafer resulting from the lifting off, and planarizing the bottom of the upper silicon wafer by a chemical-mechanical polishing method, thereby obtaining a substrate for making a through silicon via.

3. The manufacturing method of a through silicon via structure for three-dimensional integrated circuit packaging of claim 2, wherein a hydrogen ion implantation energy is selected to be greater than 5000 KeV to obtain a through silicon via with a depth greater than 50 microns.

4. The manufacturing method of a through silicon via structure for three-dimensional integrated circuit packaging of claim 2, wherein a temperature range for annealing the silicon wafer is 300-400° C.

5. The manufacturing method of a through silicon via structure for three-dimensional integrated circuit packaging of claim 1, wherein the conductive metal material is copper.

6. A through silicon via structure for three-dimensional integrated circuit packaging, comprising:
  a through silicon via penetrating a substrate;
  an insulating medium covering a sidewall of the through silicon via and upper and lower surfaces of the substrate;
  a copper diffusion barrier layer and a seed layer, wherein the copper diffusion barrier layer covers a surface of the insulating medium on the sidewall of the through silicon via, and the seed layer covers a surface of the copper diffusion barrier layer;
  conductive metal material and contact pads, wherein the conductive metal material completely fills the through silicon via, extends upward and downward, and protrudes from upper and lower surfaces of the insulating medium; and the contact pads are disposed on the top and bottom of the conductive metal material,
  wherein the conductive metal material is in direct contact with the seed layer, and the conductive metal material is not in direct contact with the sacrificial layer;
  wherein the insulating medium disposed on the sidewall of the through silicon via is covered by the copper diffusion barrier layer, the upper and lower surfaces of the insulating medium are not covered by the copper diffusion barrier layer, and the copper diffusion barrier layer disposed on the sidewall of the through silicon via is covered by the seed layer.

7. The through silicon via structure for three-dimensional integrated circuit packaging of claim 6, wherein the conductive metal material is copper.

8. The through silicon via structure for three-dimensional integrated circuit packaging of claim 6, wherein the insulating medium is at least one of $SiO_2$, $Si_3N_4$, SiON, SiCOH, and SiCOFH.

9. The through silicon via structure for three-dimensional integrated circuit packaging of claim 6, wherein the copper diffusion barrier layer is at least one of TaN, TiN, ZrN, and $MnSiO_3$.

10. The through silicon via structure for three-dimensional integrated circuit packaging of claim 6, wherein the seed layer is at least one of Cu, Ru, Co, RuCo, CuRu, and CuCo.

* * * * *